(12) United States Patent
Isono et al.

(10) Patent No.: US 8,679,317 B2
(45) Date of Patent: Mar. 25, 2014

(54) COPPER ELECTROPLATING BATH

(75) Inventors: Toshihisa Isono, Hirakata (JP); Shinji Tachibana, Hirakata (JP); Tomohiro Kawase, Hirakata (JP); Naoyuki Omura, Hirakata (JP)

(73) Assignee: C. Uyemura & Co., Ltd., Osaka-shi (JP)

( * ) Notice: Subject to any disclaimer, the term of this patent is extended or adjusted under 35 U.S.C. 154(b) by 662 days.

(21) Appl. No.: 12/599,436

(22) PCT Filed: May 21, 2007

(86) PCT No.: PCT/JP2007/060364
§ 371 (c)(1),
(2), (4) Date: Nov. 9, 2009

(87) PCT Pub. No.: WO2008/142770
PCT Pub. Date: Nov. 27, 2008

(65) Prior Publication Data
US 2010/0219081 A1    Sep. 2, 2010

(51) Int. Cl.
| C25D 3/00 | (2006.01) |
| C25D 3/38 | (2006.01) |
| C25D 3/02 | (2006.01) |
| H01L 21/02 | (2006.01) |
| H05K 3/42 | (2006.01) |

(52) U.S. Cl.
CPC .. *C25D 3/38* (2013.01); *C25D 3/00* (2013.01); *C25D 3/02* (2013.01); *H01L 21/02* (2013.01); *H05K 3/424* (2013.01)
USPC ............. 205/296; 205/80; 205/157; 205/261; 205/291

(58) Field of Classification Search
USPC ........................................ 205/118
See application file for complete search history.

(56) References Cited

U.S. PATENT DOCUMENTS

| 3,502,551 A | 3/1970 | Todt et al. |
| 6,024,857 A | 2/2000 | Reid |

(Continued)

FOREIGN PATENT DOCUMENTS

| EP | 1069211 A2 | 1/2001 |
| JP | 57-114685 A | 7/1982 |

(Continued)

OTHER PUBLICATIONS

Supplementary European Search Report dated Dec. 23, 2011, issued in corresponding European Patent Application No. 07743798.6.

(Continued)

*Primary Examiner* — Jonathan Johnson
*Assistant Examiner* — Ho-Sung Chung
(74) *Attorney, Agent, or Firm* — Westerman, Hattori, Daniels & Adrian, LLP

(57) ABSTRACT

A copper electroplating bath useful in filling non-through holes formed on a substrate which contains a water-soluble copper salt, sulfuric acid, and chloride ions and further contains a brightener, a carrier, and a leveler as additives, wherein the leveler contains at least one water-soluble polymer containing quaternary nitrogen, tertiary nitrogen, or both which are cationizable in a solution. In the copper electroplating bath, the filling power for non-through holes formed on a substrate can be easily controlled so as to fit to the size of the holes only by changing the quaternary nitrogen to tertiary nitrogen ratio of the water-soluble polymer to be used as the leveler, which enables copper electroplating of non-through holes of various sizes with a good fit to the sizes.

6 Claims, 3 Drawing Sheets

(56) References Cited

U.S. PATENT DOCUMENTS

| | | | |
|---|---|---|---|
| 7,220,347 B2 * | 5/2007 | Isono et al. | 205/118 |
| 2002/0036144 A1 | 3/2002 | Lee et al. | |
| 2003/0106802 A1 | 6/2003 | Hagiwara et al. | |
| 2004/0187731 A1 * | 9/2004 | Wang et al. | 106/1.13 |
| 2004/0217009 A1 | 11/2004 | Mikkola et al. | |
| 2005/0045486 A1 | 3/2005 | Sahoda et al. | |
| 2005/0072683 A1 | 4/2005 | Nakada et al. | |
| 2005/0126919 A1 * | 6/2005 | Kubota et al. | 205/125 |
| 2006/0016693 A1 | 1/2006 | Wang et al. | |
| 2006/0207886 A1 | 9/2006 | Isono et al. | |
| 2007/0084732 A1 * | 4/2007 | Wang et al. | 205/296 |

FOREIGN PATENT DOCUMENTS

| | | |
|---|---|---|
| JP | 2001-073182 A | 3/2001 |
| JP | 2001-200386 A | 7/2001 |
| JP | 2002-115090 A | 4/2002 |
| JP | 2003-013277 A | 1/2003 |
| JP | 2004-068088 A | 3/2004 |
| JP | 2004-169188 A | 6/2004 |
| JP | 2005-029818 A | 2/2005 |
| JP | 2005-126803 A | 5/2005 |
| JP | 2005-139516 A | 6/2005 |
| JP | 2006-037232 A | 2/2006 |
| JP | 2006-045621 A | 2/2006 |
| JP | 2006-057177 A | 3/2006 |
| JP | 2007-138265 A | 6/2007 |
| JP | 2007-146285 A | 6/2007 |
| WO | 02/090623 A1 | 11/2002 |
| WO | 2005/008759 A1 | 1/2005 |
| WO | 2005/066391 A1 | 7/2005 |
| WO | 2006/094755 A1 | 9/2006 |

OTHER PUBLICATIONS

Korean Office Action dated Jul. 12, 2013, issued in corresponding Korean Patent Application No. 10-2009-7025134.

International Search Report of PCT/JP2007/060364, mailing date of Aug. 28, 2007.

* cited by examiner

COPPER ELECTROPLATING BATH

TECHNICAL FIELD

The present invention relates to an electrolytic copper plating bath wherein the capability of filling, with copper by plating, blind via holes formed on a substrate can be optimized in conformity with the size of the blind via holes.

BACKGROUND ART

As miniaturization of electronic parts is in progress and a higher degree of integration has been therefore demanded, packages are transferred from peripheral terminal packaging and area terminal packaging to three-dimensional packaging. Accordingly, with semiconductor chips and interposers, electric conduction or junction with TSV (through silicon via) has been under study for putting into practical use. For the TSV (through silicon via), it is required to fill via holes with a copper plated film by electrolytic copper plating like copper damascene or via filling of printed circuit boards. In printed circuit boards, it becomes necessary to simultaneously carry out via filling and through-hole plating.

The copper sulfate plating bath used in a via fill plating technique makes use, as additives, of an accelerator called brightener and made of a sulfur-containing organic compound, a carrier made of a polyether compound, and a suppresser called leveler and made of a nitrogen-containing compound. Generally, the brightener is fast in diffusion rate and the carrier and leveler are slower in diffusion rate than the former. Conventionally, the copper sulfate plating bath for via fill has made use of a leveler whose diffusion rate is especially slow as selected among levelers, with which there has been adopted a technique wherein plating deposition on a surface side of a via hole substrate (an upper end portion at a side face of the via holes) is suppressed thereby filling the inside of the via holes by plated copper.

Where via holes having a small diameter or deep via holes are filled with plated copper according to such a technique, a difference in potential between the surface side and the bottom of the via hole substrate becomes great thereby worsening a current distribution inside the via holes. Accordingly, if no effects of the additives are expected, deposition in the vicinity of the surface becomes larger than at the bottom to cause voids to occur. Thus, filling with plated copper is not possible. In addition, with respect to the difference in concentration gradient caused by diffusion in the plating bath, i.e. the thickness of the diffusion layer, where the via hole has a small diameter or depth, the difference between the vicinity of the surface and the bottom of the via hole becomes great, resulting in a thick via bottom.

Via fill plating utilizes a difference in diffusion rate between the leveler and the brightener so as to perform fill plating of copper in via holes. The diffusion rate of the leveler is slower than that of the brightener, so that the leveler is supplied to a thin surface of the diffusion layer and a surface side of the via holes thereby permitting a suppressing action to develop. At the bottom side of the via holes at which the diffusion layer is thick, the leveler does not follow the supply of the brightener and thus, the accelerating action becomes predominant, under which a film grows predominantly from the bottom side of the via holes and the via holes are filled with plated copper.

In this technique of making use of the action of the leveler, an optimum value of the difference in diffusion rate between the surface side and the bottom side of the via hole required for the leveler differs depending on the size of the via hole, i.e. a diameter and depth of an opening and an aspect ratio, so that it has been necessary to find out a leveler exhibiting a good fill plating capability after testing a number of levelers for different via holes.

In this manner, in order not to cause plating failures such as of voids and the like upon filling with plated copper, it is necessary to optimize the diffusion rate of leveler. However, there exist via holes of a wide variety of sizes for different substrates, for which there has been demanded an electrolytic copper plating bath that is easily controllable in diffusion rate in conformity with the diameter and aspect ratio of via holes formed in a substrate.

It will be noted that the following is related art document information related to this invention.
Patent Document 1: JP-A 2003-253490
Patent Document 2: JP-A 2004-43957
Patent Document 3: U.S. Pat. No. 6,024,857
Patent Document 4: JP-B 51-18894
Patent Document 5: JP-B 57-27190
Patent Document 6: JP-B 58-21035
Patent Document 7: JP-A 5-230687
Patent Document 8: JP-A 2001-73182
Patent Document 9: JP-A 2005-29818
Non-patent Document 1: Hideki Hagiwara and two others, "Practical Application of a Copper Sulfate Plating Solution for Via Filling of Buildup Substrates," The Surface Finishing Society of Japan, Abstract of the 101st Annual Meeting of the Surface Science of Japan, 21D-5, pp. 232 to 233
Non-patent Document 2: Takuji Matsunami and three others, "Copper Sulfate Plating Additives for Via Filling," MES2000 (the Tenth Microelectronics Symposium) Collected Papers, November, 2000, pp. 39 to 42
on-patent Document 3: Norihiro Yamakawa and three others, "Shape Control for Via Conduction Plating," MES1999 (the 9th Microelectronics Symposium) Collected Papers, October, 1999, pp. 209 to 212
Non-patent Document 4: Ken Kobayashi and four others. "Study on a Bath Composition Influencing Via Filling Capability by Electrolytic Copper Plating," Journal of Japan Institute of Electronic Packaging, 2000, Vol. 3, No. 4, pp. 324 to 329
on-patent Document 5: "Current Status and Future Prospect of Copper Sulfate Plating," Text for the 60th Surface Technology Academic Study and Discussion Conference, The Surface Finishing Society of Japan, November, Heisei 13 (2001), p. 2

DISCLOSURE OF THE INVENTION

Problems to be Solved by the Invention

The present invention has been made under such circumstances as set out above and has for its object the provision of an electrolytic copper plating bath that is able to optimize a capability of filling blind via holes formed on a substrate by copper plating by easy control in conformity with the size of the blind via holes.

Means for Solving the Problems

We have made intensive studies so as to solve the above problem and, as a result, found that when using an electrolytic copper plating bath which includes a water-soluble copper salt, sulfuric acid and chloride ions, and, as additives, a brightener, a carrier and a leveler wherein the leveler includes one or more of water-soluble polymers containing quaternary nitrogen, tertiary nitrogen or both that are cationizable in solution, blind via holes formed on a substrate can be filled with copper and that when changing only a quaternary nitrogen to tertiary nitrogen ratio of the water-soluble polymers as the leveler, a variety of blind via holes including, for example, blind via holes having a high aspect ratio and blind via holes having a low aspect ratio can be fill-plated by electrolytic copper plating in conformity with different sizes of the blind via holes, thereby arriving at completion of the invention.

Accordingly, the invention provides the following electrolytic copper plating baths.

[1] An electrolytic copper plating bath used for filling blind via holes formed on a substrate with copper, characterized by including a water-soluble copper salt, sulfuric acid and chloride ions, and, as additives, a brightener, a carrier and a leveler, wherein said leveler contains one or more of water-soluble polymers containing quaternary nitrogen, tertiary nitrogen or both that are capable of being cationized in solution.

[2] The electrolytic copper plating bath as set forth in [1], characterized in that a quaternary nitrogen to tertiary nitrogen ratio in the water soluble polymers is controlled depending on a hole diameter and an aspect ratio (hole depth/hole diameter) of intended blind via holes.

[3] The electrolytic copper plating bath as set forth in [1] or [2], characterized in that the brightener is made of a sulfur additive selected from those of the following formulas (1) to (4):

[Chemical Formula 1]

$$H-S-(CH_2)_a-(O)_b-SO_3M \quad (1)$$

$$\begin{array}{l} S-(CH_2)_a-(O)_b-SO_3M \\ | \\ (S)_c-(CH_2)_a-(O)_b-SO_3M \end{array} \quad (2)$$

$$\begin{array}{l} R_1 \\ \phantom{R_1}\backslash \\ \phantom{R_1}N-C-S-(CH_2)_a-(CHOH)_d-(CH_2)_a-(O)_b-SO_3M \\ \phantom{R_1}/ \phantom{-}\| \\ R_2 \phantom{-}S \end{array} \quad (3)$$

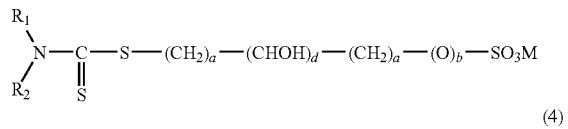
$$R_3-O-C-S-(CH_2)_a-(CHOH)_d-(CH_2)_a-(O)_b-SO_3M \\ \phantom{R_3-O-}\| \\ \phantom{R_3-O-}S \quad (4)$$

(wherein $R_1$, $R_2$ and $R_3$, respectively, represent an alkyl group having 1 to 5 carbon atoms, M represents a hydrogen atom or an alkali metal, a is an integer of 1 to 8, and b, c and d are, respectively, 0 or 1), and the carrier is made of a polyalkylene glycol represented by the following formula (5):

$$HO-(R_4-O)_e-H \quad (5)$$

(wherein $R_4$ represents an alkylene group having 2 or 3 carbon atoms and e is an integer of 4 or more).

[4] The electrolytic copper plating bath as set forth in [3], characterized in that the carrier is made of polyethylene glycol, polypropylene glycol or a copolymer of ethylene glycol and propylene glycol.

[5] The electrolytic copper plating bath as set forth in any of [1] to [4], characterized in that a hole diameter of the blind via holes ranges 1 to 100 μm and an aspect ratio (hole depth/hole diameter) ranges 0.5 to 5 and that the water-soluble polymer is made of (A) a homopolymer that has a carbon main chain and has, at side chains, quaternary nitrogen capable of being cationized in solution.

[6] The electrolytic copper plating bath as set forth in any of [1] to [4], characterized in that a hole diameter of the blind via holes ranges 1 to 150 μm and an aspect ratio (hole depth/hole diameter) ranges 0.3 to 1.5 and that the water-soluble polymer is made of (B) a copolymer that has a carbon main chain and has, at side chains, quaternary nitrogen and tertiary nitrogen capable of being cationized in solution.

[7] The electrolytic copper plating bath as set forth in any of [1] to [4], characterized in that a hole diameter of the blind via holes ranges 1 to 200 μm and an aspect ratio (hole depth/hole diameter) ranges 0.3 to 0.6 and that the water-soluble polymer is made of (C) a homopolymer and/or copolymer that has a carbon main chain and has, at side chains, tertiary nitrogen capable of being cationized in solution and is free of quaternary nitrogen.

[8] The electrolytic copper plating bath as set forth in any of [1] to [4], characterized in that a hole diameter of the blind via holes ranges 1 to 150 μm and an aspect ratio (hole depth/hole diameter) ranges 0.3 to 1.5 and that the water-soluble polymer is made of a mixture of (A) the homopolymer that has a carbon main chain and has, at side chains, quaternary nitrogen capable of being cationized in solution and/or ((B) the copolymer that has a carbon main chain and has, at side chains, quaternary nitrogen and tertiary nitrogen capable of being cationized in solution, and (C) a homopolymer and/or copolymer that has a carbon main chain and has, at side chains, tertiary nitrogen capable of being cationized in solution and is free of quaternary nitrogen.

Effect of the Invention

According to the invention, the capability of fill plating with copper of an electrolytic copper plating bath for filling blind via holes formed on a substrate with plated copper can be simply controlled in conformity with the size of the blind via holes only by changing a quaternary nitrogen to tertiary nitrogen ratio of a water-soluble polymer serving as a leveler, thereby permitting electrolytic copper plating to be performed in conformity with different sizes of blind via holes.

BEST MODE FOR CARRYING OUT THE INVENTION

Figure 1:
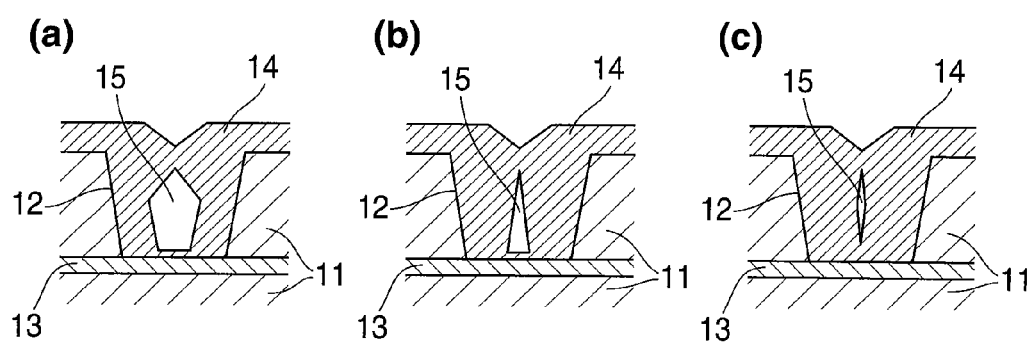
FIG. 1 is a schematic sectional view of via holes for classifying the shape of via holes in which a void is formed in examples.

The invention is now described in more detail.

The electrolytic copper plating bath of the present invention is an electrolytic copper plating bath used for filling, with copper, blind via holes formed on a substrate and includes a water-soluble copper salt, sulfuric acid and chloride ions, and, as additives, a brightener, a carrier and leveler wherein the leveler contains one or more of water-soluble polymers containing quaternary nitrogen, tertiary nitrogen or both capable of being cationized in solution.

The electrolytic copper plating bath of the present invention contains a leveler wherein a water-soluble polymer containing tertiary nitrogen (i.e. nitrogen to which three carbon atoms are bonded) and quaternary nitrogen (i.e. nitrogen to which four carbon atoms are bonded) in the molecule is used as the leveler. This enables the diffusion rate of the leveler to be minutely controlled upon electrolytic copper plating by changing the ratio of tertiary nitrogen to quaternary nitrogen in the leveler molecule.

The nitrogen-containing compound called leveler acts as a cation in an acidic bath and electrically concentrates at a highly charged portion thereby suppressing a plated film from being deposited. It is considered that although this action of the nitrogen-containing compound is expected for both the quaternary nitrogen and the tertiary nitrogen, the quaternary nitrogen assuming a positive charge has a stronger suppressing action against plating.

Hence, there can be provided an electrolytic plating bath exhibiting an optimum capability of filling blind via holes, such as via holes, by electrolytic copper plating in conformity with a size thereof by controlling a ratio of quaternary nitrogen to tertiary nitrogen. This enables more efficient plating selection. Moreover, there can be provided an electrolytic copper plating bath, which has an excellent fill plating capability without causing defects, such as voids, to occur, for every size of blind via holes.

Water-soluble polymers that contain quaternary nitrogen, tertiary nitrogen or both thereof capable of being cationized in solution include (A) homopolymers having a carbon main chain and quaternary nitrogen capable of being cationized in solution at side chains and are, for example, those homopolymers of nitrogen-containing compounds, which contain, along with an ethylenical double bond (i.e. a group containing a structure represented by $CH_2$=CR— (wherein R represents a hydrogen atom or a hydrocarbon group), e.g. a vinyl group, an allyl group or the like), quaternary nitrogen capable of being cationized in solution, preferably tertiary nitrogen as well as quaternary nitrogen capable of being cationized in solution.

More particularly, mention is preferably made of a homopolymer represented by the following formula (6):

[Chemical Formula 2]

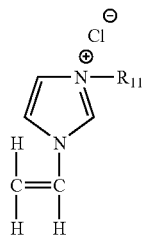

(6)

(wherein $R_{11}$ represents an alkyl group, preferably an alkyl group having 1 to 4 carbon atoms and more preferably a methyl group or an ethyl group, and in is an integer of 2 or more) of a monocyclic nitrogen-containing heterocyclic ring group-bearing nitrogen-containing compound containing tertiary nitrogen along with quaternary nitrogen capable of being cationized in solution in the ring, such as a vinyl imidazolium quaternized product represented by the following formula (7):

[Chemical formula 3]

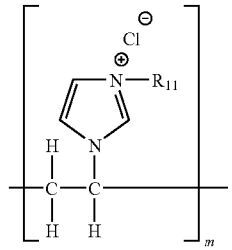

(7)

(wherein $R_{11}$ has the same meaning as defined above).

In this case, the water-soluble polymer consists of a homopolymer that has a hydrocarbon main chain formed of vinyl groups ($CH_2$=CH—) in chains and has such a structure wherein a monocyclic nitrogen-containing heterocyclic ring group is bonded to the hydrocarbon main chain through the tertiary nitrogen thereof and the carbon atom of the main chain.

Such a homopolymer is a polymer whose main chain is derived from the vinyl groups. Accordingly, unlike a monomer, the flexible linear chain thereof mitigates the influence the steric hindrance and smoothly arrives at the side faces of via holes, at which the quaternary nitrogen (cation) of the imidazole at the rigid side chain concentrates at a highly charged portion, thereby ensuring a strong suppressing action against as a leveler.

When using a homopolymer having a carbon main chain and quaternary nitrogen capable of being cationized in solution at side chains, there can be provided an electrolytic copper plating bath that is favored for fill plating of blind via holes having a hole diameter of 1 to 100 μm an aspect ratio (hole depth/hole diameter) of 0.5 to 5.

As a water-soluble polymer having quaternary nitrogen, tertiary nitrogen or both capable of being cationized in solution, mention is made of (B) copolymers that have a carbon main chain, and quaternary nitrogen and tertiary nitrogen capable of being cationized in solution at side chains. Examples include copolymers of nitrogen-containing compounds having an ethylenical double bond and containing quaternary nitrogen capable of being cationized in solution, preferably tertiary nitrogen along with the quaternary nitrogen capable of being cationized in solution, and nitrogen-containing compound having an ethylenical double bond and containing tertiary nitrogen but not containing quaternary nitrogen.

More particularly, there may be mentioned copolymers of nitrogen-containing compounds, such as a vinyl imidazolium quaternarized product represented by the afore-indicated formula (6), which have a monocyclic nitrogen-containing heterocyclic ring group containing, in the ring, quaternary nitrogen capable of being cationized in solution and tertiary nitrogen, and nitrogen-containing compounds, which do not contain quaternary nitrogen but contain tertiary nitrogen, such as N-vinylpyrrolidone, N-vinylimidazole, N-vinylcaprolactam and the like. Especially, there can be favorably mentioned a copolymer represented by the following formula (8) and made up of N-vinylpyrrolidone and a vinylimidazolium quaternarized product:

[Chemical Formula 4]

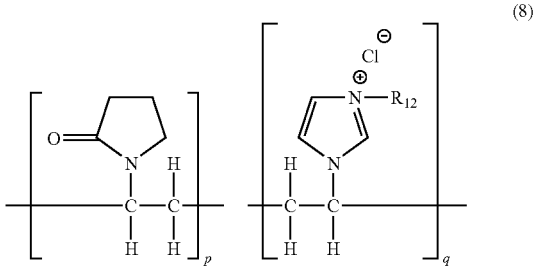

(8)

(wherein $R_{12}$ represents an alkyl group, preferably an alkyl group having 1 to 4 carbon atoms and more preferably a methyl group or an ethyl group, and p and q are, respective an integer of 1 or more, preferably 10 to 1000).

In this case, the water-soluble polymer consists of a copolymer that has a hydrocarbon main chain formed of vinyl groups ($CH_2$=CH—) in chain and also has such a structure that the monocyclic nitrogen-containing heterocyclic ring group is bonded to the hydrocarbon main chain through the tertiary nitrogen of the ring group and the carbon of the main chain.

The copolymer having a carbon main chain and quaternary nitrogen and tertiary nitrogen capable of being cationized in solution at side chains includes a copolymer of a nitrogen-containing compound, which has an allyl group and contains tertiary nitrogen without containing quaternary nitrogen, and a nitrogen-containing compound, which has an allyl group and contains quaternary nitrogen capable of being cationized in solution. A preferred copolymer includes, for example, a copolymer of a diallyldialkylammonium chloride represented by the following formula (9):

[Chemical Formula 5]

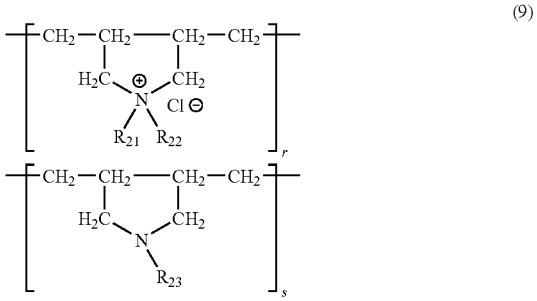

(9)

(wherein $R_{21}$ and $R_{22}$, respectively, represent an unsubstituted alkyl group having 1 to 4 carbon atoms, $R_{23}$ represents a substituted or unsubstituted alkyl group having 1 to 3 carbon atoms, and r and s are, respectively, an integer of 1 or more, preferably 10 to 1000), and an N-alkyldiallylamine. It will be noted that in the above formula (9), $R_{21}$ and $R_{22}$, are preferably a methyl group or an ethyl group, and examples for $R_{23}$ include unsubstituted alkyl groups such as a methyl group, an ethyl group, an n-propyl group and an iso-propyl group, and substituted alkyl groups wherein part or all of the hydrogen atoms bonded to the carbon atoms of these unsubstituted alkyl groups are replaced by a halogen atom such as a chlorine atom, a hydroxyl group or the like, e.g. a 3-chloro-2-hydroxypropyl group.

In this case, the water-soluble polymer consists of a copolymer wherein a hydrocarbon main chain is formed by condensation and linkage of the allyl groups of a monomer containing two allyl groups ($CH_2$=CH—$CH_2$—), to which a nitrogen-containing cyclic structure is so formed as to have the —$CH_2$—$CH_2$— moiety, which is formed by the condensation, shared therewith.

Where such a copolymer having the carbon main chain and also having quaternary nitrogen and tertiary nitrogen capable of being cationized in solution at side chains is used, the resulting electrolytic copper plating bath is suited for fill plating of blind via holes having a hole diameter of 1 to 150 μm and an aspect ratio (hole depth/hole diameter) of 0.3 to 1.5.

Further, as a water-soluble polymer having quaternary nitrogen, tertiary nitrogen or both capable of being cationized in solution, mention is made of (C) a homopolymer and/or copolymer which has a carbon main chain and contains tertiary nitrogen capable of being cationized in solution at side chain and is free of quaternary nitrogen. For example, there is mentioned a homopolymer and/or copolymer of a nitrogen-containing compound having an ethylenical double bond and containing tertiary nitrogen but not containing quaternary nitrogen.

More particularly, mention is made of homopolymers made of one of nitrogen-containing compounds, which contain tertiary nitrogen and is free of quaternary nitrogen, such as N-vinylpyrrolidone, N-vinylimidazole, N-vinylcaprolactam and the like and copolymers of two or more thereof.

In this case, the water-soluble polymer consists of a homopolymer or copolymer that has a hydrocarbon main chain formed of vinyl groups ($CH_2$=CH—) in chain and also has such a structure wherein a monocyclic nitrogen-containing heterocyclic ring group is bonded to the hydrocarbon main chain through tertiary nitrogen thereof and the carbon of the main chain.

Where there is used such a homopolymer and/or copolymer having the carbon main chain and tertiary nitrogen capable of being cationized in solution at the side chain without containing quaternary nitrogen, the resulting electrolytic copper plating bath is suited for fill plating of blind via holes having a hole diameter of 1 to 200 μm and an aspect ratio (hole depth/hole diameter) of 0.3 to 0.6.

Still further, the water-soluble polymer having quaternary nitrogen, tertiary nitrogen or both capable of being cationized in solution may be made of a mixture of (A) the homopolymer having the carbon main chain and quaternary nitrogen capable of being cationized in solution at side chains and/or (B) the copolymer having the carbon main chain and quaternary nitrogen and tertiary nitrogen capable of being cationized in solution at side chains, and (C) the homopolymer and/or copolymer having the carbon main chain and also having tertiary nitrogen capable of being cationized in solution at side chains without containing quaternary nitrogen. When changing a mixing ratio between (A) the homopolymer and/or (B) the copolymer and (C) the homopolymer and/or copolymer, it is possible to control the diffusion rate of the leveler upon electrolytic copper plating.

In this case, there can be obtained an electrolytic copper plating bath which is suited for fill plating of blind via holes having a hole diameter of 1 to 150 μm and an aspect ratio (hole depth/hole diameter) of 0.3 to 1.5.

The use of this plating bath against a substrate which has both blind via holes such as via holes and through bores such as through holes is very effective in simultaneously fill plating of the blind via holes with copper and plating of the through holes.

Especially, the electrolytic copper plating bath including as a leveler such a homopolymer that has a carbon main chain and quaternary nitrogen capable of being cationized in solution at side chains or a copolymer that has a carbon main chain and quaternary nitrogen and tertiary nitrogen capable of being cationized in solution at side chains is able to supply the leveler throughout the inside of through holes whose diffusion layer thickness is more constant than in the via holes. Accordingly, if plating of through holes is carried out in an ordinary plating step simultaneously with fill plating of via holes with copper, the thickness of the through holes at the shoulder portion thereof does not become small and an excellent film having a uniform layer thickness can be formed within a relatively short time.

Further, the electrolytic copper plating bath including such a water-soluble polymer as a leveler is advantageous in that not only fill plating of via holes with copper, but also physical properties of the film formed on a substrate are good and, especially, there can be formed a film that is small in hardness and tensile strength and is very flexible. Moreover, an advantage is involved in that in pattern plating, a difference in thickness between a portion at which a plated film is in contact with a resist and a central portion is small and there can be formed a film having high thickness uniformity throughout the film, thereby not lowering etching characteristics.

It will be noted the shape of blind via holes covered in the practice of the present invention is not critical and those holes having openings which are circular, elliptical, polygonal such as quadrilateral or the like in shape may be usable. The diameter in case where an aspect ratio is defined is intended to mean the shortest length selected among lines connecting arbitrary two points on a periphery of an opening while passing through the median point of aperture plane.

In the practice of the present invention, the concentration of the leveler in the electrolytic copper plating bath may range 0.01 to 1000 mg/L, especially 0.1 to 100 mg/L and preferably 0.1 to 50 mg/L.

On the other hand, in the practice of the present invention, the electrolytic copper plating bath contains as a copper source a water-soluble copper salt such as copper sulfate or the like and, for example, with copper sulfate, the concentration is one corresponding to 30 to 300 g/L for copper sulfate pentahydrate. Additionally, the electrolytic copper plating bath of the present invention contains sulfuric acid and chloride ions and a concentration of sulfuric acid may range 30 to 300 g/L and a concentration of chloride ions may range 20 to 150 mg/L, preferably 30 to 100 mg/L.

Further, in the practice of the present invention, in order to permit efficient deposition from via bottom, a brightener serving as a nucleus development accelerator and a carrier serving as a nucleus growth suppresser are added to the electrolytic copper plating bath. The brightener should preferably contain one or two or more of sulfur additives represented by the following formulas (1) to (4):

[Chemical Formula 6]

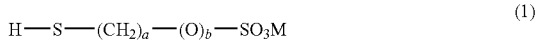
(1)

(2)

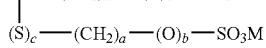

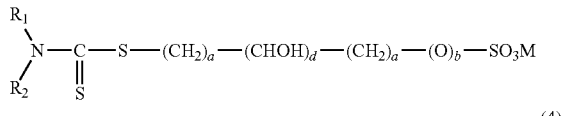
(3)

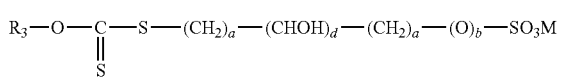
(4)

(wherein $R_1$, $R_2$ and $R_3$, respectively, represent an alkyl group having 1 to 5 carbon atoms, preferably a methyl group or an ethyl group and $R_1$, $R_2$ and $R_3$, respectively, may be the same or different, M represents a hydrogen atom or an alkali metal to such as sodium, potassium or the like, a is an integer of 1 to 8, preferably 1 to 5 and more preferably 3, and b, c and d are, respectively, 0 or 1).

The brightener specifically includes those represented is by the following formulas (10) to (13):

[Chemical Formula 7]

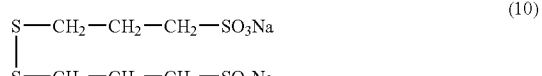
(10)

(11)

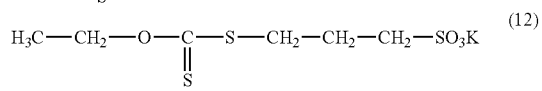
(12)

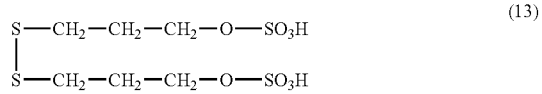
(13)

The carrier should preferably contain a polyalkylene glycol represented by the following formula (5):

(5)

(wherein $R_4$ represents an alkylene group having 2 or 3 carbon atoms (ethylene group or propylene group) and $R_4$'s may be the same or different, and e is an integer of 4 or more, preferably 10 to 250).

It will be noted that the above alkylene glycol may be any of polyethylene glycol, polypropylene glycol and a copolymer of ethylene glycol and propylene glycol, with an average molecular weight (weight average molecular weight) thereof being 200 or more, preferably 500 to 15000.

When using the leveler, brightener and carrier in combination, plating growth from the bottom face side of via holes predominantly proceeds by synergistic action with the plating suppression action of the leveler over from the substrate surface side of a via hole (an upper end portion at the side face of the via hole) to the central portion of the via hole. This enables the via holes to be reliably filled through copper plating within a relatively short time without developing voids. Moreover, because the recess amount formed above the plated layer filling a via hole therewith can be made small, the layer thickness on the substrate surface (plated surface) can be made thin. Additionally, plating under a high current density becomes possible, for which a is shortage of working hours can be expected.

It should be noted that the concentration of the brightener in the electrolytic copper plating bath of the invention may range 0.01 to 100 mg/L, preferably 0.1 to 30 mg/L.

In the practice of the present invention, the concentration of the carrier in the electrolytic copper plating bath may range 0.001 to 2000 mg/L, preferably 50 to 500 mg/L.

In the present invention, although conventional known conditions may be applicable to as electrolytic plating conditions, a cathode current density may range 0.05 to 5 A/dm$^2$, preferably 0.5 to 3 A/dm$^2$. For agitation, there may be used ordinarily employed techniques such as, for example, of aeration, jet flow, squeegee and the like. The anode may be any of known ones and either a soluble anode or insoluble anode such as of a copper sheet may be used. The plating temperature can be set at 15 to 35° C., especially at 22 to 28° C.

EXAMPLES

The present invention is more particularly illustrated by way of Examples, which should not be construed as limiting the invention thereto.

Examples 1 to 8

Electrolytic copper plating baths indicated in Table 1 were used for carrying out the following plating operations to evaluate plating characteristics.

(i) Pattern Plating

After chemical copper plating of a substrate having via holes having an opening of 60 μmΦ and a depth of 60 μm, an electroplated resist was formed in a thickness of 35 μm, followed by forming a resist non-covered portion (pad-forming portion: depth of 35 μm) with a width of 200 μm and electrolytic plating at 2 A/dm$^2$ for 45 minutes.

Next, in order to evaluate the fill plated state in via holes, the via hole was cut off at the opening thereof to subject this section to mirror finish to observe the presence or absence of voids. With respect to those wherein voids were found, the cross-sectional shape was classified into three shapes shown in FIGS. 1(a) to (c). It will be noted that in FIG. 1, indicated by 11 is a resin layer, by 12 is a via hole, by 13 is a copper layer, by 14 is copper (plated film) and by 15 is a void.

Figure 2:
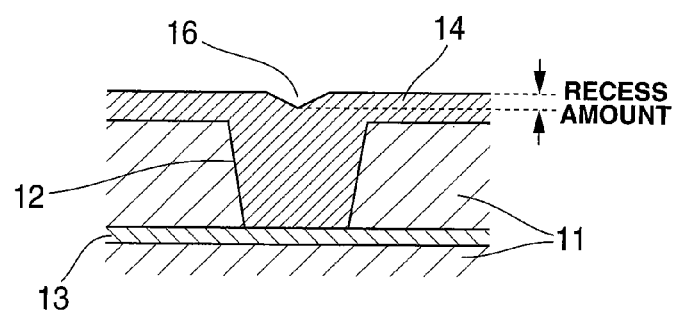
FIG. 2 is an illustrative view of a recess amount above a plated deposition filling a via hole therewith, which was measured in examples.

On the other hand, as to those where no void developed, a recess amount above the plated layer filled in the via hole was measured by means of a laser microscope. It will be noted that the recess amount is one indicated in FIG. 2. In FIG. 2, indicated by 11 is a resin layer, by 12 is a via hole, by 13 is a copper layer, by 14 is copper (plated film) and by 16 is a recess. The results are shown in Table 2.

Additionally, a film thickness x at a center of a copper plated film (pad) formed at a pad-forming portion and a film thickness y at a portion close to the resist were measured to evaluate thickness uniformity. The results are shown in Table 2.

TABLE 1

| | | Copper sulfate pentahydrate (g/L) | Sulfuric acid (g/L) | Chlorine (mg/L) | Brightener SPS | Carrier PEG | Carrier PPG | Carrier PO-EO | A | B | C | D | E | F | Kind | Nitrogen |
|---|---|---|---|---|---|---|---|---|---|---|---|---|---|---|---|---|
| Example | 1 | 200 | 50 | 50 | 1 | | | 300 | 5 | | | | | | A | Quaternary |
| | 2 | 200 | 50 | 50 | 1 | | 300 | | 2 | | 3 | | | | A + C | Tertiary + Quaternary (mix) |
| | 3 | 200 | 50 | 50 | 1 | 300 | | | | 5 | | | | | B | Tertiary + Quaternary |
| | 4 | 200 | 50 | 50 | 1 | 300 | | | | | 5 | | | | C | Tertiary |
| | 5 | 200 | 50 | 50 | 1 | | 300 | | | | | 5 | | | D | Quaternary |
| | 6 | 200 | 50 | 50 | 1 | | | 300 | | | | 2 | 2 | 2 | D + E + F | Tertiary + Quaternary (mix) |
| | 7 | 200 | 50 | 50 | 1 | 300 | | | | | | | 5 | | E | Tertiary + Quaternary |
| | 8 | 200 | 50 | 50 | 1 | | | 300 | | | | | | 5 | F | Tertiary |

SPS: bis-(3-sodium sulfopropyl)disulfide
PEG: polyethylene glycol (molecular weight of 7500)
PPG: polypropylene glycol (molecular weight of 900)
PO-EO: propylene glycol-ethylene glycol block copolymer (molecular weight of 1500)
Leveler A: poly(N-vinyl-N'-methylimidazolium chloride)
Leveler B: copolymer of vinylpyrrolidone and vinylimidazolium quaternized product
Leveler C: poly(N-vinylpyrrolidone)
Leveler D: poly(diallyldimethylammonium chloride)
Leveler E: copolymer of diallyldimethylammonium chloride and N-methyldiallylamine
Leveler F: poly(N-methyldiallylamine)

It will be noted that in Table 1, leveler A is poly(N-vinyl-N'-methylimidazolium chloride), leveler B is a copolymer of vinylpyrrolidone and vinylimidazolium quaternized product, and leveler C is poly(N-vinylpyrrolidone). Leveler D is poly(diallyldimethylammonium chloride), leveler E is a copolymer of diallyldimethylammonium chloride and N-methyidiallylamine and level F is poly(N-methyldiallylamine).

TABLE 2

| | Via Hole | | Pad Deposition | |
|---|---|---|---|---|
| | Recess Amount (μm) | Void | X | y |
| Example 1 | 15 | nil | 20 | 20 |
| Example 2 | 5 | nil | 19 | 20 |
| Example 3 | — | c | 19 | 23 |
| Example 4 | — | b | 18 | 25 |
| Example 5 | 17 | nil | 20 | 20 |
| Example 6 | 6 | nil | 19 | 21 |

TABLE 2-continued

| | Via Hole | | Pad Deposition | |
|---|---|---|---|---|
| | Recess Amount (μm) | Void | X | y |
| Example 7 | — | c | 18 | 22 |
| Example 8 | — | b | 17 | 25 |

(ii) Plating for a Through Hole which Coexists

After chemical copper plating of a substrate that had via holes having an opening of 140 μmΦ and a depth of 70 μm and through holes having an opening of 0.3 mmΦ and a length of 0.6 mm mixed therein, electrolytic copper plating was carried out at 2 A/dm² for 56 minutes.

Figure 3:
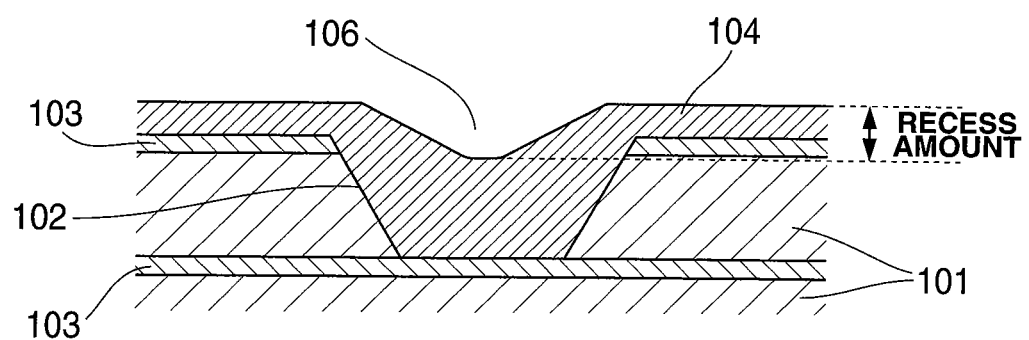
FIG. 3 is an illustrative view of a recess amount above a plated deposition filling a via hole therewith, which was measured in examples.
Figure 4:
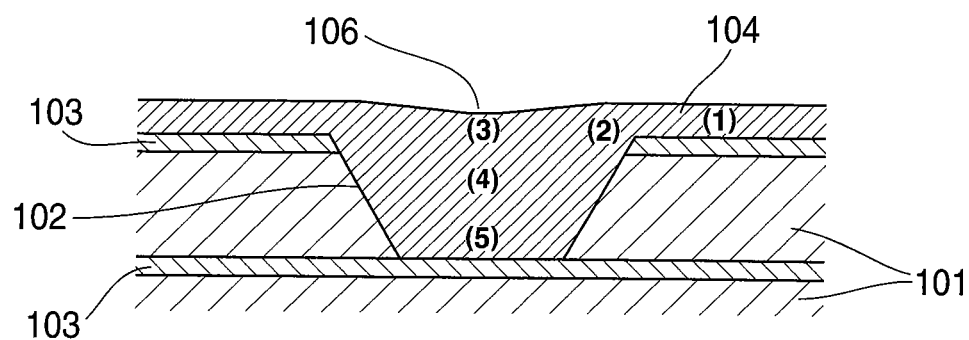
FIG. 4 is a view illustrating a position at which the Vickers hardness was measured in examples.

Next, in order to evaluate the fill plated state in the via holes, the section was taken out by cutting and mirror finished to measure a recess amount above the plated layer filled in the via holes. It will be noted that the recess amount is one indicated in FIG. 3. The Vickers hardness at the respective potions shown in FIG. 4 was measured. In FIGS. 3 and 4, indicated by 101 is a resin layer, by 102 is a via hole, by 103 is a copper layer, by 104 is copper (plated film), and by 106 is a recess. The results are shown in Table 3.

Figure 5:
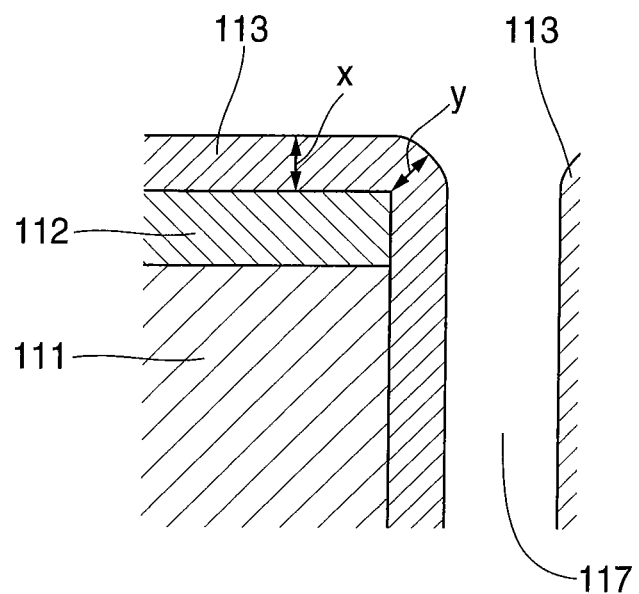
FIG. 5 is a view illustrating a plated film thickness x formed on a substrate surface and a plated film thickness y formed at a side upper end of a through hole, which were measured in examples.

To evaluate the plated state in though holes, the through holes were cut off to obtain a longitudinal section passing through the center of the opening and this longitudinal section was mirror finished, followed by measurement of a thickness x of the plated film formed on the substrate surface shown in FIG. 5 and a thickness (i.e. a thickness at a position of 135° relative to the side face of the through hole) y of the plated film formed on an upper end of the side face of a through hole (a substrate corner at the longitudinal section). The ratio (y/x) was calculated. The results are shown in. Table 3. It will be noted that in FIG. 5, indicated by 111 is a resin layer, by 112 is a copper layer, by 113 is copper (plated film) and by 117 is a through hole.

TABLE 3

| | Via Hole | | | | | | | Through Hole |
|---|---|---|---|---|---|---|---|---|
| | Recess amount | | Hardness (kgf/mm²) | | | | | |
| | (μm) | Void | (1) | (2) | (3) | (4) | (5) | y/x |
| Example 1 | 45 | nil | 89 | 87 | — | — | 93 | 0.90 |
| Example 2 | 15 | nil | 92 | 100 | — | 90 | 89 | 0.90 |
| Example 3 | 7 | nil | 98 | 92 | 99 | 86 | 95 | 0.85 |
| Example 4 | 5 | nil | 142 | 131 | 101 | 100 | 95 | 0.61 |
| Example 5 | 52 | nil | 92 | 90 | — | — | 89 | 0.95 |
| Example 6 | 16 | nil | 98 | 92 | — | 90 | 92 | 0.93 |
| Example 7 | 8 | nil | 91 | 90 | 90 | 89 | 90 | 0.90 |
| Example 8 | 5 | nil | 100 | 105 | 92 | 93 | 93 | 0.88 |

(iii) Physical Properties of Plated Films

The physical properties of plated films were evaluated according to the following method. The results are shown in Table 3.

Physical Properties of Film

Figure 6:
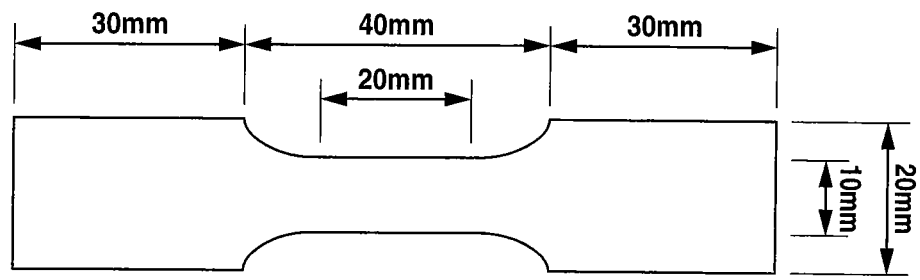
FIG. 6 is a view showing the shape and size of a test piece used to measure physical properties of films in examples.

A SUS sheet was slightly polished with an abrasive material (Scotch-Brite, 3M Co.), followed by acid cleaning treatment and electrolytic copper plating at 1.5 A/dm² for 150 minutes. After the plating, the plated film was peeled off from the SUS sheet and thermally treated at 120° C. for two hours. The film was punched into a dumbbell-shaped test piece with a size shown in FIG. 6 and subjected to measurement of a film thickness by means of a fluorescent X-ray thickness meter. Using Autograph wherein a distance between chucks was at 40 mm and a pulling rate was at 4 mm/minute, a percentage of elongation and tensile strength before the film was ruptured were evaluated after calculation using the following equations:

$$T\,[kgf/mm^2] = F\,[kgf]/(10\,[mm] \times d\,[mm])$$

T: tensile strength, F: maximum tensile strength, d: film thickness at the center of the test piece $$E[\%] = \Delta L\,[mm]/20\,[mm]$$

E: a percentage of elongation, ΔL: a length of elongation before breakage of the film The results are shown in Table 4.

TABLE 4

| | Physical Properties | |
|---|---|---|
| | Tensile strength (kgf/mm²) | Percentage of elongation (%) |
| Example 1 | 33 | 34 |
| Example 2 | 32 | 31 |
| Example 3 | 33 | 31 |
| Example 4 | 37 | 21 |
| Example 5 | 32 | 32 |
| Example 6 | 33 | 32 |
| Example 7 | 33 | 31 |
| Example 8 | 35 | 27 |

From these results, the following tendencies were shown.

Via Hole Plating

A larger amount of quaternary nitrogen leads to a more unlikelihood of developing voids with a greater recess amount.

Pad Plating

A larger amount of quaternary nitrogen leads to more improved uniformity in thickness of the pad.

Through-Hole Plating

A larger amount of quaternary nitrogen results in a thicker deposition at the corner portion, ensuring a uniform plated film.

Physical Properties of Film

A larger amount of quaternary nitrogen results in a lower hardness, especially a lower hardness at the corner portion of via hole, with the percentage of elongation becoming higher and the tensile strength becoming smaller.

The invention claimed is:

1. An electrolytic copper plating bath used for filling blind via holes formed on a substrate with copper, wherein the electrolytic copper plating bath consists of a water-soluble salt, sulfuric acid and chloride ions, and, as additives, a brightener, a carrier and a leveler, wherein said leveler consists of a copolymer (B) represented by the following formula (9):

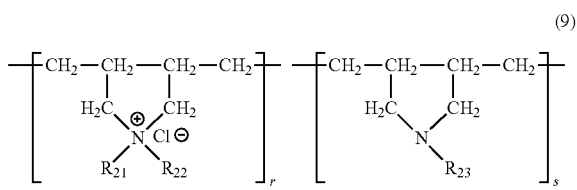

(9)

wherein $R_{21}$ and $R_{22}$, respectively, represent an unsubstituted alkyl group having 1 to 4 carbon atoms, $R_{23}$ represents a substituted or unsubstituted alkyl group having 1 to 3 carbon atoms, and r and s are, respectively, an integer of 1 or more.

2. The electrolytic copper plating bath as defined in claim 1, characterized in that a quaternary nitrogen to tertiary nitrogen ratio in said leveler is controlled depending on a hole diameter and an aspect ratio (hole depth/hole diameter) of intended blind via holes.

3. The electrolytic copper plating bath as defined in claim 1, characterized in that said brightener is made of a sulfur additive selected from those of the following formulas (1) to (4):

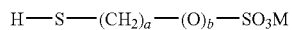
(1)

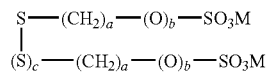
(2)

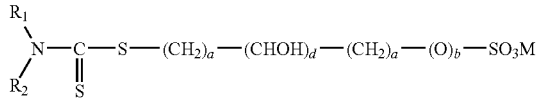
(3)

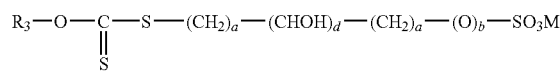
(4)

wherein $R_1$, $R_2$ and $R_3$, respectively, represent an alkyl group having 1 to 5 carbon atoms, M represents a hydrogen atom or an alkali metal, a is an integer of 1 to 8, and b, c and d are, respectively, 0 or 1, and said carrier is made of a polyalkylene glycol represented by the following formula (5):

(5)

wherein $R_4$ represents an alkylene group having 2 or 3 carbon atoms and e is an integer of 4 or more.

4. The electrolytic copper plating bath as defined in claim 3, characterized in that said brightener is made of a sulfur additive selected from those of the formula (2).

5. The electrolytic copper plating bath as defined in claim 4, characterized in that said brightener is bis-(3-sodium sulfopropyl)disulfide.

6. The electrolytic copper plating bath as defined in claim 1, characterized in that a hole diameter of said blind via holes ranges 1 to 150 μm and an aspect ratio (hole depth/hole diameter) ranges 0.3 to 1.5.

* * * * *